United States Patent [19]
Bullock et al.

[11] Patent Number: 4,952,448
[45] Date of Patent: Aug. 28, 1990

[54] FIBER REINFORCED POLYMERIC STRUCTURE FOR EMI SHIELDING AND PROCESS FOR MAKING SAME

[75] Inventors: Daniel E. Bullock, Attleboro; Horold F. Giles, Jr., Cheshire; Walter L. Hall, Pittsfield, all of Mass.

[73] Assignee: General Electric Company, Pittsfield, Mass.

[21] Appl. No.: 347,104

[22] Filed: May 3, 1989

[51] Int. Cl.$^5$ .............................................. B32B 5/16
[52] U.S. Cl. ...................................... 428/323; 428/328; 428/379; 428/412
[58] Field of Search ............... 428/285, 290, 297, 379, 428/412, 457, 902, 323, 328; 252/512; 174/35 GC; 523/137

[56] References Cited

U.S. PATENT DOCUMENTS

| | | | |
|---|---|---|---|
| 3,871,952 | 3/1975 | Robertson | 162/101 |
| 3,938,782 | 2/1976 | Robertson | 259/4 R |
| 4,500,595 | 2/1985 | Gerteisen et al. | 428/294 |
| 4,522,875 | 6/1985 | Still, Jr. et al. | 428/285 |
| 4,543,288 | 9/1985 | Radvan et al. | 428/297 |
| 4,566,990 | 1/1986 | Liu et al. | 252/503 |
| 4,596,670 | 6/1986 | Liu | 252/511 |
| 4,670,331 | 1/1987 | Radvan et al. | 428/363 |
| 4,678,699 | 7/1987 | Kritchevsky et al. | 428/175 |
| 4,716,072 | 12/1987 | Kim | 428/212 |
| 4,734,321 | 3/1988 | Radvan et al. | 428/283 |
| 4,780,575 | 10/1988 | Falvin et al. | 428/288 |

FOREIGN PATENT DOCUMENTS

| | | | |
|---|---|---|---|
| 1072060 | 4/1986 | Japan | 523/137 |
| 8400555 | 2/1984 | World Int. Prop. O. | 523/137 |

*Primary Examiner*—Marion C. McCamish
*Attorney, Agent, or Firm*—Spencer D. Conard

[57] ABSTRACT

A fibre reinforced plastic structure comprising a matrix of thermoplastic material and conductive fibres provides effective EMI shielding. Process for making the structure permits the employ of relatively long conductive fibres which reduce the fibre loading required for effective shielding.

15 Claims, No Drawings

FIBER REINFORCED POLYMERIC STRUCTURE FOR EMI SHIELDING AND PROCESS FOR MAKING SAME

BACKGROUND OF THE INVENTION

The present invention relates to a fiber reinforced thermoplastic structure having high electromagnetic/radio frequency interference (EMI/RFI) shielding effectiveness, and more particularly relates to an EMI/RFI shielding structure, and process for making the same, that has a thermoplastic layer containing a network of conductive fibers held in a thermoplastic matrix.

Electronic equipment, particularly sensitive electronic equipment such as computers, business machines, communications equipment and the like are all susceptible to malfunction as a result of EMI/RFI. Furthermore, in addition to being sensitive to foreign EMI/RFI, many electronic devices generate EMI/RFI, and if not properly shielded, emit large quantities of EMI/RFI energy. During the early years of the electronic age, EMI/RFI shielding of electronic equipment was accomplished by conductive metallic housings. However, with the boom in the use of nonconductive plastic materials in the electronic industry, particularly as sturdy, lightweight housings, EMI/RFI has become a great problem.

Much research has been undertaken to provide plastic housings having EMI/RFI shielding effectiveness. Until recently, EMI/RFI shielding effectiveness in plastics was accomplished by conductive coatings, metallization, and plating of molded plastic parts. These methods, while effective, are costly and labor intensive in that they require substantial amounts of material and involve secondary operations in preparing the final product.

Recently, attempts have been made to prepare conductive plastics by incorporating in engineering thermoplastics certain conductive fillers. Specifically, these fillers include conductive powders, flakes and fibers. Generally, approximately 25–40% by weight conductive powder, 36–49% by weight conductive flake or 25–30% by weight conductive fiber must be incorporated into plastic materials in order to obtain the desired levels of EMI/RFI shielding. Parts made therefrom have generally been made by injection molding processes. (Materials Engineering, March, 1982, P. 37–43; Modern Plastics International, September 1982, P. 46–49).

Injection molding of structures containing conductive fibers has had a number of shortcomings. Namely, the extruder screw used to injection mold blends of thermoplastic resin and conductive fiber has had a tendency to tear the fibers, reducing the average lengths from an initial fiber length of about ¼ inch to a final average length of about 1/32 inch in the molded structure. These shorter fibers are less efficient in forming a continuous conductive network and thus require relatively higher loadings to achieve the same shielding effectiveness as can be achieved by lower loadings of longer fibers. In other words, loadings of shorter fibers are less effective in EMI/RFI shielding than are similar weight percent loadings of longer fibers. Producing EMI/RFI shielding structures from conventional injection molding also typically requires that the fibers be dispersed throughout the structure often requiring large amounts of the relatively expensive conductive fibers.

Accordingly, it is one object of the present invention to provide a thermoplastic structure employing relatively longer conductive fibers than is found in injection molded structures.

It is another object of the present invention to provide a structure which concentrates the fibers into a relatively thin layer of the structure to reduce the total loading of conductive fibers while obtaining a desired level of EMI/RFI shielding.

SUMMARY OF THE INVENTION

It has been found that improved EMI/RFI shielding can be attained by relatively low loadings of conductive fibers forming a conductive network in a thermoplastic matrix. Further, it has been found that multilayered structures exhibiting effective EMI/RFI shielding and having relatively low loadings of conductive fibers can be obtained by concentrating the conductive fibers in a relatively thin layer of the structure. A network of relatively long conductive fiber lengths in a thermoplastic matrix is achievable by utilizing a liquid suspending medium in the form of an aqueous foam in which the fibers and thermoplastic particulates are dispersed and suspended and from which they are made into a web on a foaminous support by collapsing the foam and drawing the liquid. The web is then dried, compressed and heated to melt the thermoplastic about the fiber network whereupon cooling the conductive network is securely held in a thermoplastic matrix. Additional layers can be formed prior or subsequent to the conductive layer. These additional layers can be substantially free of conductive fibers to reduce the cost of the additional layers while providing additional and necessary support for the conductive layer. These multilayer structures provide the necessary structural strength while minimizing the total amount of conductive fibers necessary to provide effective EMI/RFI shielding.

DETAILED DESCRIPTION OF THE INVENTION

The present invention concerns a thermoplastic structure having an EMI/RFI shielding layer which comprises (a) a thermoplastic polymer resin; and (b) conductive fibers having an average length of at least about 0.125 inch per fiber.

Preferred thermoplastic polymers for use in the various layers of the invention include polyesters, polycarbonates, polyestercarbonates, polyamides, polyarylene ether sulfones or ketones, polyamide imides, polyetherimides, polyphenylene ethers, polystyrenes, polyolefins, acrylonitrile butadiene styrene copolymers or blends thereof. These thermoplastic polymers may further comprise one or more addition polymers and/or one or more rubber or rubber modified thermoplastic resins and the preferred thermoplastic polymer for use in the layers of the structure is an aromatic polycarbonate formed by reacting a dihydroxy diaryl compound e.g. bisphenol A, with a carbonate precursor, e.g., phosgene, see for example U.S. Pat. No. 3,153,008, incorporated herein by reference.

Preferably, the thermoplastic polymer is present in the shielding layer at a level selected from between about 40% to about 95% by weight based on the total weight of the shielding layer, more preferably at a level between about 40% and about 75% by weight thereof, and most preferably at a level between about 55% and about 70% by weight thereof.

Suitable conductive fibers may be selected from the group consisting of silver, copper, nickel, aluminum or stainless steel conductive fibers and metal coated fibers comprising a base fiber of glass, graphite and the like upon which a metal coat of nickel, silver, copper or aluminum is applied. The preferred conductive fibers are nickel coated graphite fibers having an average diameter of approximately 12 microns and having an average length of approximately 0.25 inch.

Preferably, the conductive fibers are present in the shielding layer at a level selected from between 5% and about 40% by weight of said shielding layer; more preferably from between about 7.5% and about 30% by weight thereof; and most preferably from between about 10% and about 25% by weight thereof. Preferably, the conductive fibers have an average length of at least about ⅛ inch; more preferably have an average length selected from between about 0.125 inch and about 0.50 inch; and most preferably have an average length of about 0.25 inch.

Preferably the shielding layer further comprises from 0% to 40% chopped glass based on the total weight of the layer; more preferably from 15% to 30% by weight thereof; and most preferably about 20% by weight thereof. Preferably the glass has an average length of between 0.125 inch and 0.75 inch and has a diameter of between 2 and 25 microns.

The preferred structure contains a shielding layer comprising conductive fibers in a thermoplastic matrix; and a supporting layer free of conductive fibers and comprising nonconductive reinforcing fibers, such as glass fibers, held in a thermoplastic matrix. Preferred structures have total thicknesses of from 0.050 inch to 0.160 inch. The shielding layer provides the structure with the desired level of EMI/RFI shielding while utilizing a minimum amount of relatively expensive conductive fibers, and the supporting layer provides the structure with the additional strength and rigidity required for housing electronic equipment or microwave ovens. Effective amounts of flame retardants may be present in the shielding layer and/or the supporting layer. Preferably, the shielding layer has a thickness selected from between about 0.010 inch and about 0.045 inch to provide the desired level of EMI/RFI shielding without undue, conductive fiber costs. The thickness of the supporting layer will depend on the degree of strength needed for the structure but preferably the supporting layer has a thickness selected from between about 0.080 inch and about 0.125 inch. Preferably the supporting layer comprises from 0% to 40% by weight glass fibers based on the total weight of the supporting layer, more preferably from 5% to 35% by weight thereof, and most preferably 30% by weight thereof; the supporting layer preferably also comprises from 100% to 60% by weight of a thermoplastic polymer based on the total weight of the supporting layer, more preferably from 95% to 65% by weight thereof and most preferably 70% by weight thereof. The structure of the present invention can be thermoformed or stamped into a desired form, especially electronic equipment components or housings, requiring EMI shielding and such forms are included within the scope of this invention. It is further contemplated that the structure may have multiple layers including additional thermoplastic polymeric resin layers shielding layers and supporting layers.

By employing conductive fiber lengths of at least 0.125 inches shielding effectiveness is enhanced, and by concentrating the conductive fibers in relatively thin shielding layers, effective shielding is obtained with minimum loadings of conductive fibers. Preferably the conductive fiber loadings are at a level of less than 400 $g/m^2$ for the structure, and more preferably are between 75 $g/m^2$ and 300 $g/m^2$, and most preferably at a level of about 250 $g/m^2$.

The process involved in the preparation of the structures present invention forming a non-woven fibrous web by utilizing a liquid suspending medium in the form of an aqueous foam in which conductive fibers are dispersed and suspended. The foam is then collapsed and drained to produce a fiber web in a thermoplastic surrounding. The webs and surrounding are then dried, heated to a temperature above the softening temperature of the thermoplastic resin, compressed, and then cooled to produce a conductive fiber network held in a solid thermoplastic matrix. Portions of the process employed are in some aspects similar to a paper making process set out in Gatward, et. al., U.S. Pat. No. 3,716,449.

According to this invention, fibers and thermoplastic particulates to be formed into a web are dispersed in foamed surfactant-containing water which has been brought to a state of extreme emulsification of air therein.

A thick, viscous emulsion is formed by dispersing air in an aqueous solution of an emulsifying agent in the form of bubbles, so small that even the largest is barely visible to the naked eye. The number average bubble diameter, as determined in the manner hereinafter described, should be no greater than about 0.2 mm. The foam should contain at least 65 percent of air or, in other words, the specific gravity of the foam should not be greater than 0.35. Moreover, the viscosity of the foam emulsion should not be less than 22 seconds as measured at 20° C. using Ford Cup Type B-4 in the manner called for by British Standard 1733.

Preferably, vortical foam production occurs so as to cause maximum emulsification by minute bubbles occurring at the base of a vortex while coarser bubbles tend to rise and accumulate at the surface in equilibrium with the vortical forces which tend to suck them down into the vortex with air so as to become further emulsified into minute bubbles. The vortical foaming action is continued until the desired emulsification of air is attained in the region adjacent the base of the vortex from which the foam is taken for deposit on the web-forming foraminous surface of the web-forming machine. During the formation of the foam, the fibers and particulates to be formed into the web are dispersed in the foam so as to be present in the highly emulsified foam.

The fibers particulates and surfacant-containing water are introduced, preferably concurrently from separate sources, into the foam-producing means. The surfacant-containing water is reused after it drains from the foam when the foam collapses to form a fibrous particulate containing web on the wire or other foraminous support of the web-forming machine and is reintroduced directly into the foam-producing means. The reintroduction preferably being controlled responsive to the liquid level occurring in the foam-producing means. The surfacant-containing liquid drained from the web during its formation is returned to the foam-producing means partly substantially fiber-free and partly with fibers dispersed therein. The introduction of fresh water in a thickened fiber particulate dispersion is balanced in relation to the dryness of the web that is removed from the web-forming machine whereby maximum conservation of surfactant may be afforded. The thermoplastic particulates are preferably in the nature of a fine powder having an average particle size of from between about 300 microns and about 800 microns. The thermoplastic particulates may also be in the nature of thermoplastic pellets, beads and/or fibers as well as variations thereof as long as they can be dispersed in the aforementioned foamed emulsions. The preferred particulates are made from bisphenol-A type polycarbonate resin.

When fibers and particulates are dispersed in a liquid medium of the kind specified in the above summary the medium possesses thixotropic-pseudoplastic properties in that it combines the advantages of high viscosity under low stresses such as occur when the fibers cease the motion imparted thereby by the dispersing machinery, with low viscosity and an acceptably fast rate of drainage when subject to pressure against a supporting wire during the drainage and formation of a fibrous web on a usual paper-making machine. It is also found that fibers and particulates dispersed in such a liquid medium quickly become immobile when agitation ceases and remain well dispersed to form a substantially uniform web. Materials formed in this manner have the advantage of very uniform distribution of fibers over their area. The suspension of fibers and particulates in an emulsion of air can be obtained at a consistency, that is ratio of fiber and particulates to liquid. The deposition and drainage of the suspensions in order to form a fibrous web may be accomplished using currently available papermaking machinery with only slight modifications. Alternatively, new machinery can be constructed to form fibrous thermoplastic webs from the suspension, which machinery is substantially more simple in design and operation than is conventional paper-making machinery.

When preparing the thixotropic-pseudoplastic liquid medium the chemical nature of the emulsifying agent used is found not to be critical provided that it has an emulsifying power sufficient to produce a thick, viscous emulsion of very small air bubbles. The emulsifying agent may be anionic, cationic, or non-ionic and it has been found that proprietary surfaceactive agents such as that sold under the name "ACE" liquid, this being an anionic substance, by Industrial Soaps Ltd., that sold as "TEXOFOR RN 15," a non-ionic substance, by Glover Chemicals Ltd., and that sold as "AMINE Fb 19," a cationic substance, by Float-Ore Ltd., are all suitable for making the required viscous emulsion. Another anionic emulsifying agent that has been used is octylphenoxypolyethoxy ethanol. One of the most useful emulsifying agents is commercial grade dodecylbenzenesulfonate. Soap flakes may also be used. It is, however, to be understood that the emulsifying agent used may depend on the fibrous material and thermoplastic particulates which are to be employed. The emulsifying agent is mixed with water and the use of hot water may be an advantage in preparing the emulsion but hot water is not essential.

The emulsion may be prepared in any suitable kind of emulsifying apparatus subject to the proviso that the apparatus is capable of emulsifying air in the form of very small bubbles, the largest of which is barely visible to the naked eye, in the liquid and of maintaining this dispersion. Machines which provide high rates of shear are required. Although these machines provide high shear rates for the liquids, the fibers do not experience high shear forces directly and thus are not broken down into short fibers. It has been found that a modified froth flotation cell of the type made by Denver Equipment Co., Denver, Colo., provides a suitable emulsifying action. Effective vortical mixing utilizing such foam-producing means is described more in detail hereinbelow.

It is essential that the concentration of the emulsifying agent be sufficiently high and that the action of the emulsifying apparatus be sufficiently vigorous to produce a finely dispersed emulsion of air in water. It will be understood that if the concentration of the emulsifying agent is too low only a thin fluid emulsion will be obtained which will soon separate into a liquid layer and a coarse froth, and that if the concentration is sufficiently high but the emulsifying action of the apparatus is insufficiently vigorous a thick, viscous emulsion may not form at all. It will further be understood that it is necessary to control the amount of air dispersed in the emulsion because if too much air is folded in the emulsion will turn into a dry, coarse froth with large bubbles and will not be suitable for making a uniform dispersion of fibers. A satisfactory emulsion is one which has a viscosity greater than 22 seconds, when measured by Ford Cup Type B-4 according to British Standard 1733, and the air content of the foam is not less than 65 percent by volume, that is, the foam has a specific gravity not greater than 0.35, provided that the largest bubble is barely visible to the naked eye. When reference is made herein and in the claims to the viscosity being at least 22 seconds (measured in the manner aforesaid) the reference is to the vicosity of foam produced in the absence of the fibers, but under conditions corresponding precisely with the conditions that prevail when producing the foamed furnish, the reason being that the presence of the fibers interferes with obtaining an accurate measurement of viscosity. The extent to which the largest bubble may be visible to the naked eye may be determined by examination of the foam furnish. The number average diameter of the bubbles in a foam is determined by placing a drop of foam produced in the absence of fibers but produced under conditions precisely corresponding with those that prevail during the formation of the foamed furnish on a microscope slide. Photomicrographs are taken at 100 magnification at successive intervals of 1 minute. The number of bubbles visible in the field of view on each photomicrograph is counted. It is found that the number of visible bubbles appears to decrease exponentially with time to a constant value, that is:

$$\log (N-X) = No - kT$$

where
$N$ = the number of bubbles visible at time T
$X$ = a number to be determined by trial and error
$No$ = the (supposed) number of bubbles visible at time $T = 0$, i.e., when the sample was taken
$k$ = a constant
$T$ = time elapsed from the time the sample was taken The value of No is determined graphically by plotting $\log (N-X)$ against T, value of X being adjusted until the graph forms the best possible straight line. Extrapolating the graph to $T - 0$, namely, the value of No at the intersection of the line with the $\log (N-X)$ axis, one may obtain No, the "supposed" number of bubbles at the time when the sample was taken. Dividing the area of the field of view by No, one obtains the number average area per bubble, and hence the number average bubble diameter.

It is possible to disperse fibers and thermoplastic particulates in the liquid medium concurrently with the formation of the emulsion, or alternatively to insert the fibers and particulates, either dry or as a suspension in water, into the prepared, i.e., foamed, liquid medium and effect dispersion in the same apparatus as is used to prepare the liquid medium. The preferred method of effecting dispersion of fibers in the liquid emulsion is to transfer the prepared liquid medium from the apparatus in which it is prepared to another apparatus and there to add to it and to disperse in it a suspension of fibers in a small quantity of water.

The prepared, substantially uniform, suspension flows or is pumped to and deposited as a layer on the moving wire of a Fourdriner type paper-making machine, or the surface of a cylinder type board machine, or the web-forming area of other suitable forms of apparatus known in the art of paper making. Upon the application of suction to the other side of the wire the layer of emulsion collapses and drains, leaving on the surface of the wire a web of fibers of a superior degree of uniformity. While spreading of the suspension of fibers on the wire and the collapsing and draining of the resulting layer of emulsion can be effected by any of the methods known in the art, the spreading is preferably effected by the use of an enclosed flow spreader of relatively low volume, for example, of the kind described in British Pat. No. 1,075,103, and is then collapsed by means of suction applied to the underside of the wire, after which the formed web is handled as in a usual paper-making process.

Surfactant-containing water drained from the foam during formation on the foraminous support of the web-forming machine is effectively reutilized and at least a part thereof is returned directly to the foam-producing means as, for example, so as to be introduced adjacent the mouth of the vortex of a vortical foam-producing unit, and in order to control the consistency of the foamed fibers furnish its introduction may be permitted by a sensing device that is responsive to liquid level in the foam-producing means. Fiber may be introduced separately either dry or in the form of a thickened slurry. When introduced in the form of a thickened slurry, the fresh water content of the slurry is controlled in balanced relation to the water content of the web as it is removed from the web-forming machine. Part of the drained water may be mixed with edge trim or other fibers and separately introduced into the foam-producing means. Erratic pumping action occasioned by the presence of foam in the surfacant-containing water is successfully overcome by the employment of a positive displacement pump whose capacity preferably is greatly increased by sucking additional liquid into a jet stream of the output of said pump.

An advantage of the process is that multilayer sheets may be formed without difficulty. Several layers of fibrous suspension may be collapsed and drained consecutively upon already formed mat, that is, by using several headboxes suspended above and along part of the length of the wire. The position of each headbox would coincide with a bank of suction boxes positioned on the underside of the wire. In the normal paper-making process, where the fibers are dispersed in water this would necessitate large quantities of water from the second and successive headboxes being drained through the previously formed mats, resulting in poor formation. In the process according to the invention little liquid has to be drained through the previously formed mats and collapsing and draining of the emulsion does not unduly disturb the formation. Because of the high viscosity of the foamed suspension its drainage may be accelerated at a more controlled rate, namely, on a larger number of suction boxes, without the disadvantage of the stock flocculating.

It is preferred that in the multilayer sheets of the present invention that the conductive fibers be located in a single shielding layer with other of the layers being supporting layers containing non-conductive reinforcing fibers for enhancing the strength of the structure or sheet while minimizing the amount of the relatively expensive conductive fibers in the sheet.

Suitable apparatus for conducting the web-forming process of the present invention is set out and explained in Gatward, et. al., U.S. Pat. No. 3,716,449.

Once the fibrous particulate web is produced, the thermoplastic structure may be formed by further drying the web to remove excess water therefrom, compressing the web and heating the web to a temperature above the softening temperature of the thermoplastic particulates so that the thermoplastic will form a continuous matrix about the continuous fiber network. This drying, compressing and heating can be applied to single layer or multilayer webs. When conductive fibers are employed the fibers form a conductive shielding network serves as an effective shield of EMI/RFI such as caused by microwave radiation. The ability of the fibers to form a conductive network, and thus an effective shield, is greatly enhanced as the average length of fibers is increased. This process permits the creation of structures having relatively long conductive fibers therein which have superior abilities to form continuous conductive fiber networks as well as provide structures having superior impact strengths when compared with structures employing identical weight loadings of shorter length fibers as results in conventional extrusion and injection molding operations.

Numerous known techniques may be used for the production of the sheet according to the invention. Thus, a web of fibres and plastics powder may be produced by the process described in U.K. Pat. Nos. 1129757 and 1329409, after which it is immediately consolidated by means of a hot press. The process employed to make the structure must minimize breakage of the conductive fibers and must also permit the formation of multilayered structures having the conductive fibers concentrated in certain layers or a certain layer of the structure.

In order that those skilled in the art may better understand how to practice the present invention, the following examples are given by way of illustration and not by way of limitation.

EMI shielding effectiveness data was determined based on a coaxial transmission method developed by Battelle Laboratory of Columbus, Ohio. Shielding effectiveness is a measure of the attenuation of EMI/RFI expressed in decibels wherein attenuation is a function of the electrical conductivity and/or magnetic susceptability of the shield. The decibel unit is a logarithmetic measure of the degree of the shielding. A 10 decibel reading indicates that 90% of the EMI/RFI energy is effectively dissipated. Twenty decibels means that 99% of the EMI/RFI is dissipated, and so on. The shielding effectiveness is measured at various radio frequencies. In each of the following examples, shielding effectiveness was determined over a frequency range of 30 MHz to 1000 MHz.

EXAMPLES

The structures in Table I each had four layers. The layers prepared by dispersing fibers in foam to make non-woven webs in a thermoplastic surrounding. The thermoplastic employed in each structure was an aromatic polycarbonate derived from bisphenol-A and phosgene. The glass employed in the structures has an average fiber length of 0.50 inches and diameter of 10 microns. The columns titled Glass, PC and NCG represent the amounts of Glass, PC and NCG in each of the four layers of each structure. The NCG is Nickel Coated fibers having an average diameter of about 12 microns and an average length of about 0.25 inches. The numerals 1, 2, 3 and 4 represent the four layers of the structure, so far example, sample B had in its first layer 15% by weight glass, 75% by weight resin, and 10% by weight NCG; sample B in each of its 2nd, 3rd and 4th layers had 30% by weight glass, 60% by weight resin and 10% by weight NCG. The total weight of nickel coated graphite present in the samples is set forth based on grams per meter squared of sample.

TABLE 1

| Sample | Resin | Glass % | | | | Resin % | | | | NCG % | | | | Total Wt. NCG g/m² |
|---|---|---|---|---|---|---|---|---|---|---|---|---|---|---|
| | | 1 | 2 | 3 | 4 | 1 | 2 | 3 | 4 | 1 | 2 | 3 | 4 | |
| A | Lex 121 | 0 | 0 | 0 | 0 | 90 | 90 | 90 | 90 | 10 | 10 | 10 | 10 | 386.0 |
| B | Lex 121 | 15 | 30 | 30 | 30 | 75 | 60 | 60 | 60 | 10 | 10 | 10 | 10 | 386.0 |
| C | Lex 121 | 20 | 30 | 30 | 30 | 40 | 70 | 70 | 70 | 40 | 0 | 0 | 0 | 386.0 |
| D | Lex 121 | 20 | 30 | 30 | 30 | 55 | 70 | 70 | 70 | 25 | 0 | 0 | 0 | 241.3 |
| E | Lex 121 | 20 | 30 | 30 | 30 | 70 | 70 | 70 | 70 | 10 | 0 | 0 | 0 | 96.5 |
| F | Lex 121 | 30 | 30 | 30 | 30 | 60 | 70 | 70 | 70 | 10 | 0 | 0 | 0 | 96.5 |

Table 2 represents the average shielding effectiveness in decibles (dB) of the structures of Examples A–F of Table 1. The shielding effectiveness obtained by the structure of Example C is superior to that of Example B at Frequencies of 100 and 30, and the shielding effectiveness of examples C–F having lower loadings of conductive fiber compare favorably with higher loadings of conductive fibers in the injection molded structures of Table 3. Duplicate samples of A–F were made to determine repeatability and were labeled A1, A2, etc. as set forth in Table 2.

TABLE 2

| | Average Shielding Effeciency DB MHz | | | |
|---|---|---|---|---|
| Example | 1000 | 300 | 100 | 30 |
| A1 | 62 | 47 | 35 | 47 |
| A2 | 62 | 53 | 34 | 44 |
| B1 | 74 | 64 | 57 | 68 |
| B2 | 78 | 67 | 60 | 70 |
| C1 | 57 | 55 | 62 | 75 |
| C2 | 68 | 58 | 67 | >80 |
| D1 | 60 | 60 | 64 | 75 |
| D2 | 54 | 57 | 58 | 74 |
| E1 | 58 | 37 | 55 | 65 |
| E2 | 49 | 46 | 55 | 66 |
| F1 | 62 | 55 | 60 | 73 |
| F2 | 51 | 51 | 58 | 72 |

The following samples were obtained by injection molding (IM) NCG fibers with an aromatic polycarbonate resin. MHz represents the frequency employed in Mega Hertz. The percents given are weight percents of NCG based on the total weight of the injection molded article. The columns set forth the shielding effectiveness of the injection molded samples at various frequencies and conductive fiber loadings.

TABLE 3

| | Shielding Effectiveness, dB, average | | | | Total Wt. NCG g/m² |
|---|---|---|---|---|---|
| Sample | 1000 MHz | 300 MHz | 100 MHz | 30 MHz | |
| IM 7% NCG | 63 | 57 | 31 | 34 | 290 |
| IM 10% NCG | 66 | 58 | 31 | 34 | 409 |
| IM 15% NCG | 66 | 60 | 48 | 62 | 633 |

What is claimed is:

1. A thermoplastic structure comprising:
   (a) a shielding layer having from 95% to 40% by weight of a thermoplastic resin based on the total weight of said shielding layer, and from 5% to 40% by weight of conductive fibers based on the total weight of said shielding layer, said conductive fibers being dispersed in said resin of said shielding layer, said conductive fibers having an average length of from between 0.125 inch and 0.50 inch per fiber; and
   (b) a supporting layer comprising a thermoplastic resin, said supporting layer being free of conductive fibers.

2. The structure of claim 1 wherein said conductive fibers are present at a level of from 7.5 to 30 percent by weight based on the total weight of said shielding layer.

3. The structure of claim 1 wherein said resin is selected from the group consisting of polypropylene, polyphenylene ether, polycarbonate, poly(etherimide), polybutylene terephthalate, polyethylene-terephthalate, polyphenylenesulfone, acrylonitrile butadiene styrene, and combinations thereof.

4. The structure of claim 1 wherein said conductive fiber is nickel coated graphite fiber.

5. The structure of claim 1 wherein said shielding layer further comprises from 15 to 30 percent by weight chopped glass fibers based on the total weight of said shielding layer.

6. The structure of claim 1 wherein said supporting layer further comprises from 0.5 to 30 percent by weight chopped glass fibers based on the total weight of said supporting layer.

7. The structure of claim 1 wherein said thermoplastic resin of said shielding layer and said thermoplastic resin of said supporting layer are independently selected from the group consisting of polypropylene, aromatic polycarbonate, poly(etherimide), polybutyleneterephthalate, polyphenylene ether, polyethyleneterephthalate, polyphenylenesulfone, acrylonitrile butadiene styrene and combinations thereof.

8. The structure of claim 7 wherein said conductive fibers are nickel coated graphite fibers.

9. A thermoplastic structure comprising:
   (a) a shielding layer having from 5% to 45% by weight conductive fibers based on the total weight of said shielding layer, said shielding layer having from 95% to 40% by weight thermoplastic resin based on the total weight of the shielding layer, said conductive fibers being dispersed in said thermoplastic resin of said shielding layer, said shielding layer having a thickness selected from between 0.010 inch and 0.045 inch, said conductive fibers having an average length selected from between 0.125 inch and 0.50 inch per fiber; and (b) a supporting layer having from 60% to 100% by weight thermoplastic resin, said supporting layer being free of conductive fiber, said supporting layer having a thickness selected from between 0.08 inch and 0.125 inch.

10. The structure of claim 9 wherein said conductive fibers are present in the structure at a level of between 75 g/m$^2$ and 300 g/m$^2$.

11. The structure of claim 9 wherein said structure has a total thickness of from 0.05 inch to 0.160 inch.

12. The structure of claim 11 wherein said supporting layer has from 15% to 35% by weight glass fibers based on the total weight of the supporting layer.

13. The structure of claim 9 wherein said thermoplastic resin comprises an aromatic polycarbonate resin.

14. The structure of claim 9 wherein said conductive fibers are nickel coated graphite fibers.

15. A thermoplastic structure consisting essentially of:

(a) a shielding layer having from 5% to 45% by weight conductive fibers based on the total weight of said shielding layer, said shielding layer having from 95% to 40% by weight thermoplastic resin based on the total weight of the shielding layer, said conductive fibers being dispersed in said thermoplastic resin of said shielding layer, said shielding layer having a thickness selected from between 0.010 inch and 0.045 inch, said conductive fibers having an average length selected from between 0.125 inch and 0.50 inch per fiber; and (b) a supporting layer having from 60% to 100% by weight thermoplastic resin, said supporting layer being free of conductive fiber, said supporting layer having a thickness selected from between 0.08 inch and 0.125 inch.

* * * * *